US012219876B2

(12) United States Patent
Koike et al.

(10) Patent No.: US 12,219,876 B2
(45) Date of Patent: Feb. 4, 2025

(54) METHOD FOR PRODUCING PIEZOELECTRIC ACTUATOR

(71) Applicant: Seiko Epson Corporation, Tokyo (JP)

(72) Inventors: Harunobu Koike, Matsumoto (JP); Takanori Aimono, Matsumoto (JP); Masao Nakayama, Shiojiri (JP); Motoki Takabe, Shiojiri (JP); Koji Sumi, Shiojiri (JP); Yasuhiro Itayama, Kai (JP); Toshihiro Shimizu, Fujimi (JP)

(73) Assignee: SEIKO EPSON CORPORATION (JP)

( * ) Notice: Subject to any disclaimer, the term of this patent is extended or adjusted under 35 U.S.C. 154(b) by 403 days.

(21) Appl. No.: 17/736,121

(22) Filed: May 4, 2022

(65) Prior Publication Data

US 2022/0263010 A1  Aug. 18, 2022

Related U.S. Application Data

(62) Division of application No. 17/104,153, filed on Nov. 25, 2020, now abandoned.

(30) Foreign Application Priority Data

Nov. 29, 2019  (JP) .................................. 2019-216461

(51) Int. Cl.
*H10N 30/09* (2023.01)
*C23C 14/18* (2006.01)
(Continued)

(52) U.S. Cl.
CPC ........... *H10N 30/09* (2023.02); *C23C 14/185* (2013.01); *C23C 14/34* (2013.01); *C23C 14/5806* (2013.01); *H10N 30/06* (2023.02)

(58) Field of Classification Search
CPC ...................................................... H10N 30/06
See application file for complete search history.

(56) References Cited

U.S. PATENT DOCUMENTS

| 2004/0135851 A1* | 7/2004 | Xin-Shan ............. B41J 2/14233 347/68 |
| 2008/0034563 A1 | 2/2008 | Xin-Shan et al. |

(Continued)

FOREIGN PATENT DOCUMENTS

| JP | 2005-168172 A | 6/2005 |
| JP | 2008-177353 A | 7/2008 |

(Continued)

*Primary Examiner* — Douglas M Menz
(74) *Attorney, Agent, or Firm* — Harness, Dickey & Pierce, P.L.C.

(57) ABSTRACT

A method for producing a piezoelectric actuator including forming a vibration plate, forming a first electrode on the vibration plate, forming a piezoelectric layer on the first electrode, and forming a second electrode on the piezoelectric layer, wherein the forming the vibration plate has a single layer forming step including forming a metal layer containing zirconium by a gas phase method, and forming a metal oxide layer by firing the metal layer, the single layer forming step is repeated, thereby forming the vibration plate in which the metal oxide layers are stacked, and the metal oxide layer has a thickness less than 200 nm.

8 Claims, 7 Drawing Sheets

(51) Int. Cl.
  *C23C 14/34* (2006.01)
  *C23C 14/58* (2006.01)
  *H10N 30/06* (2023.01)

(56) References Cited

U.S. PATENT DOCUMENTS

2014/0267508 A1    9/2014  Ohashi et al.
2015/0214465 A1*   7/2015  Mawatari ........... H10N 30/8554
                                                          347/68
2017/0229637 A1    8/2017  Sakai et al.

FOREIGN PATENT DOCUMENTS

JP    2010-228277 A   10/2010
JP    2014-176985 A    9/2014
JP         6205703 B2  10/2017

* cited by examiner

FIG. 9

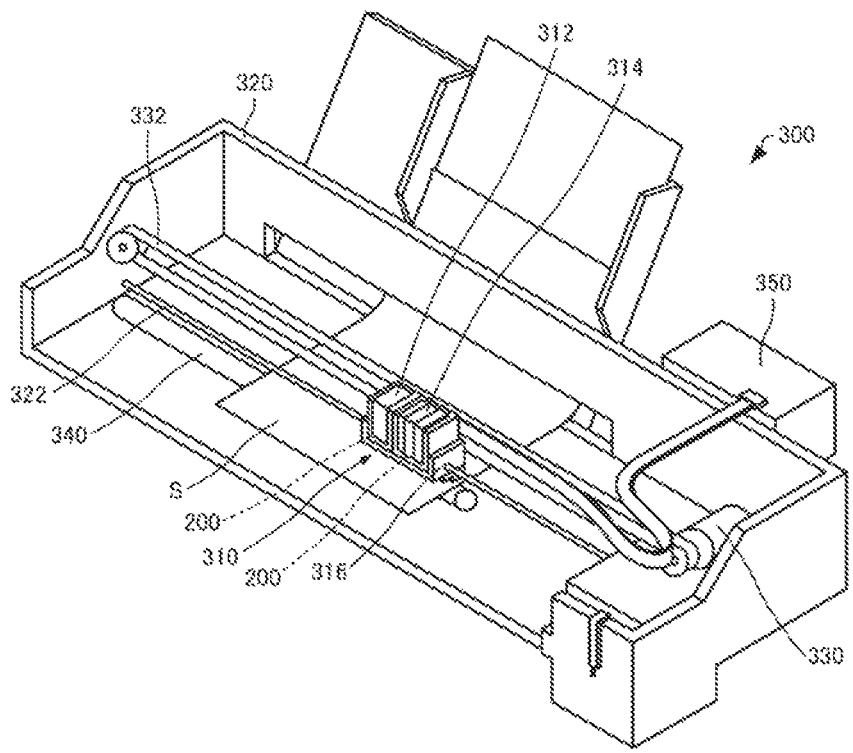

FIG. 10

| | THICKNESS OF ZrO₂ LAYER[nm] | | | | EVALUATION OF DURABILITY | RATIO |
|---|---|---|---|---|---|---|
| | FIRST LAYER | SECOND LAYER | THIRD LAYER | FOURTH LAYER | | |
| EXPERIMENTAL EXAMPLE 1 | 50 | — | — | — | B | 0.25 |
| EXPERIMENTAL EXAMPLE 2 | 100 | — | — | — | B | 0.31 |
| EXPERIMENTAL EXAMPLE 3 | 150 | — | — | — | B | |
| EXPERIMENTAL EXAMPLE 4 | 200 | — | — | — | C | 0.37 |
| EXPERIMENTAL EXAMPLE 5 | 400 | — | — | — | C | 0.65 |
| EXPERIMENTAL EXAMPLE 6 | 100 | 100 | — | — | B | — |
| EXPERIMENTAL EXAMPLE 7 | 100 | 150 | — | — | B | — |
| EXPERIMENTAL EXAMPLE 8 | 100 | 200 | — | — | C | — |
| EXPERIMENTAL EXAMPLE 9 | 100 | 300 | — | — | C | — |
| EXPERIMENTAL EXAMPLE 10 | 200 | 200 | — | — | C | — |
| EXPERIMENTAL EXAMPLE 11 | 50 | 350 | — | — | C | 0.37 |
| EXPERIMENTAL EXAMPLE 12 | 100 | 100 | 100 | — | A | — |
| EXPERIMENTAL EXAMPLE 13 | 100 | 100 | 100 | 100 | A | 0.20 |
| EXPERIMENTAL EXAMPLE 14 | 100 | 100 (LIQUID PHASE METHOD) | — | — | C | — |

METHOD FOR PRODUCING PIEZOELECTRIC ACTUATOR

CROSS-REFERENCE TO RELATED APPLICATIONS

This application is a divisional patent application of U.S. patent application Ser. No. 17/104,153, filed Nov. 25, 2020, which claims priority to Japanese Patent Application No. 2019-216461, filed Nov. 29, 2019, the disclosures of which are hereby expressly incorporated by reference herein in their entireties.

BACKGROUND

1. Technical Field

The present disclosure relates to a method for producing a piezoelectric actuator.

2. Related Art

There has been known a piezoelectric element actuator that deforms a vibration plate by a piezoelectric element. Such a piezoelectric actuator is used in, for example, a liquid ejection head or the like.

For example, JP-A-2005-168172 (Patent Document 1) describes a piezoelectric actuator including a vibration plate composed of a silicon dioxide film with a thickness of 1 µm and a zirconium oxide film with a thickness of 200 nm.

However, in Patent Document 1, the zirconium oxide film has a thickness of 200 nm, which is thick, and therefore, when it is exposed to a high temperature and high humidity environment, the zirconium oxide film is sometimes peeled from the silicon dioxide film.

SUMMARY

A method for producing a piezoelectric actuator according to one aspect of the present disclosure includes forming a vibration plate, forming a first electrode on the vibration plate, forming a piezoelectric layer on the first electrode, and forming a second electrode on the piezoelectric layer, wherein the forming the vibration plate has a single layer forming step including forming a metal layer containing zirconium by a gas phase method, and forming a metal oxide layer by firing the metal layer, the single layer forming step is repeated, thereby forming the vibration plate in which the metal oxide layers are stacked, and the metal oxide layer has a thickness less than 200 nm.

BRIEF DESCRIPTION OF THE DRAWINGS

FIG. 9 is a perspective view schematically showing a printer according to an embodiment.

FIG. 10 is a table showing evaluation results of Experimental Examples.

DESCRIPTION OF EXEMPLARY EMBODIMENTS

Hereinafter, preferred embodiments of the present disclosure will be described in detail with reference to the drawings. Note that the embodiments described below are not intended to unduly limit the contents of the present disclosure described in the appended claims. Further, not all the configurations described below are necessarily essential components of the present disclosure.

1. Piezoelectric Actuator

Figure 1:
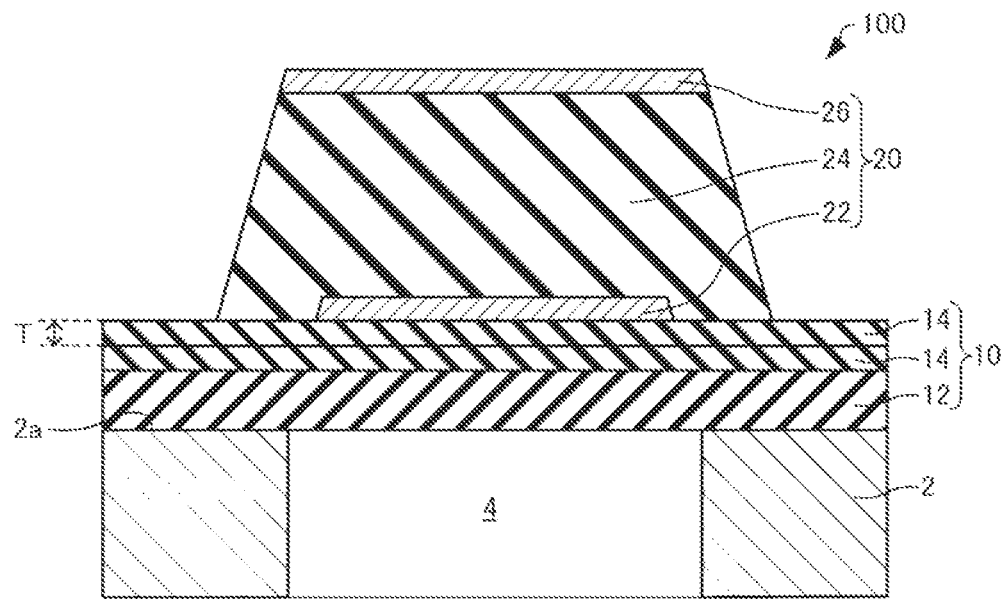
FIG. 1 is a cross-sectional view schematically showing a piezoelectric actuator according to an embodiment.

First, a piezoelectric actuator according to this embodiment will be described with reference to the drawings. FIG. 1 is a cross-sectional view schematically showing a piezoelectric actuator 100 according to this embodiment.

As shown in FIG. 1, the piezoelectric actuator 100 includes a vibration plate 10 and a piezoelectric element 20. The vibration plate 10 is provided on a basal plate 2.

The basal plate 2 is, for example, a silicon substrate. In the example shown in the drawing, the basal plate 2 is provided with an opening portion 4. The opening portion 4, for example, passes through the basal plate 2.

The vibration plate 10 has flexibility and is deformed by the action of the piezoelectric element 20. The vibration plate 10 has, for example, a silicon oxide layer 12 and a metal oxide layer 14.

The silicon oxide layer 12 is provided on the basal plate 2. The silicon oxide layer 12 may be an $SiO_2$ layer. The thickness of the silicon oxide layer is, for example, 30 nm or more and 3 µm or less.

The metal oxide layer 14 is provided on the silicon oxide layer 12. The metal oxide layer 14 contains zirconium. The metal oxide layer 14 is, for example, a zirconium oxide layer. The metal oxide layer 14 may be a $ZrO_2$ layer.

A thickness T of the metal oxide layer 14 is less then 200 nm, and preferably 10 nm or more and 180 nm or less, more preferably 50 nm or more and 150 nm or less. The thickness T of the metal oxide layer 14 can be measured by, for example, observing the cross section of the piezoelectric actuator 100 using a scanning electron microscope (SEM).

As the metal oxide layer 14, a plurality of layers are provided. In the example shown in the drawing, as the metal oxide layer 14, two layers are provided, however, the number of layers is not particularly limited, and for example, 2 or more layers and 10 or less layers, preferably, 2 or more layers and 5 or less layers. The thicknesses T of the plurality of metal oxide layers 14 may be the same or different.

Figure 2:
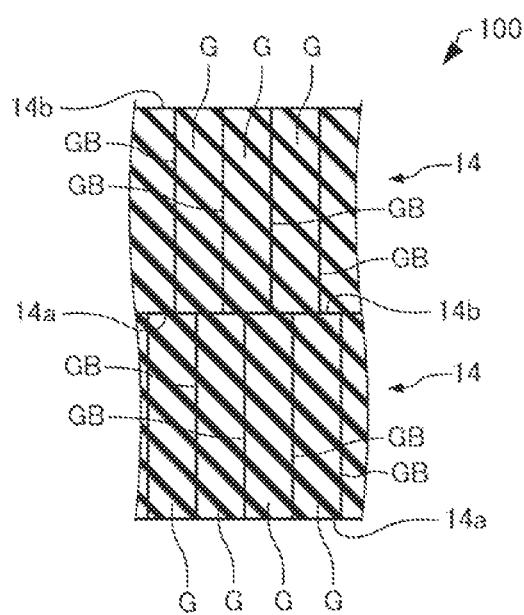
FIG. 2 is a cross-sectional view schematically showing metal oxide layers of the piezoelectric actuator according to the embodiment.

The metal oxide layer 14 has a columnar crystal structure. Here, FIG. 2 is a cross-sectional view schematically showing the metal oxide layers 14 and is a view for illustrating the columnar crystal structure. As shown in FIG. 2, the "columnar crystal structure" refers to a structure in which the shape of a crystal grain G is a columnar shape, and a grain boundary GB is continuous from a lower face 14a to an upper face 14b of the metal oxide layer 14. As shown in FIG. 2, in the two metal oxide layers 14, the grain boundary GB of one of the metal oxide layers 14 and the grain boundary GB of the other metal oxide layer 14 are shifted in a lateral direction (a direction orthogonal to a perpendicular line of an upper face 2a of the basal plate 2). In the example shown in the drawing, the grain boundary GB is linearly provided.

When X-ray diffraction (XRD) measurement is performed for the metal oxide layer 14, for example, a peak $P_{(-111)}$ attributed to a (-111) plane of the metal oxide layer 14 and a peak $P_{(-211)}$ attributed to a (-211) plane of the metal oxide layer 14 are confirmed. Further, a peak $P_{(111)}$ attributed to a (111) plane of the metal oxide layer 14 may be confirmed. The peak $P_{(-111)}$ and the peak $P_{(-211)}$ are attributed to the metal oxide layer 14 that is a monoclinic crystal system. The peak $P_{(111)}$ is attributed to the metal oxide layer 14 that is a tetragonal crystal system.

In the XRD of the metal oxide layer 14, the position of the peak $P_{(-111)}$ is 28.1° or more and 28.5° or less. The position of the peak $P_{(-211)}$ is 40.4° or more and 41.4° or less. The position of the peak $P_{(-111)}$ is 29.5° or more and 30.5° or less.

In the XRD of the metal oxide layer 14, a ratio R of an intensity of the peak $P_{(-211)}$ to an intensity of the peak $P_{(-111)}$ is, for example, 0.36 or less, preferably 0.31 or less, more preferably 0.25 or less, further more preferably 0.20 or less. The metal oxide layer 14 may be preferentially oriented to (-111). The expression "preferentially oriented to (-111)" refers to that the intensity of the peak $P_{(-111)}$ is highest among all the peaks attributed to the metal oxide layer 14. The intensity of the peak $P_{(111)}$ may be higher than the intensity of the peak $P_{(-211)}$.

As shown in FIG. 1, the piezoelectric element 20 is provided on the vibration plate 10. The piezoelectric element 20 has a first electrode 22, a piezoelectric layer 24, and a second electrode 26.

The first electrode 22 is provided on the metal oxide layer 14. The shape of the first electrode 22 is, for example, a layer shape. The thickness of the first electrode 22 is, for example, 3 nm or more and 200 nm or less. The first electrode 22 is, for example, a metal layer such as a platinum layer, an iridium layer, a titanium layer, or a ruthenium layer, an electrically conductive oxide layer thereof, a lanthanum nickel oxide ($LaNiO_3$: LNO) layer, a strontium ruthenate ($SrRuO_3$: SRO) layer, or the like. The first electrode 22 may have a structure in which a plurality of layers exemplified above are stacked.

The first electrode 22 is one of the electrodes for applying a voltage to the piezoelectric layer 24. The first electrode 22 is a lower electrode provided below the piezoelectric layer 24.

The piezoelectric layer 24 is provided on the first electrode 22. In the example shown in the drawing, the piezoelectric layer 24 is provided on the first electrode 22 and the metal oxide layer 14. The piezoelectric layer 24 is provided between the first electrode 22 and the second electrode 26. The thickness of the piezoelectric layer 24 is, for example, 200 nm or more and 2 μm or less. The piezoelectric layer 24 can be deformed by applying a voltage between the first electrode 22 and the second electrode 26.

The piezoelectric layer 24 is, for example, a composite oxide layer having a perovskite structure. The piezoelectric layer 24 is, for example, a lead zirconate titanate (Pb(Zr, Ti)$O_3$: PZT) layer, a potassium sodium niobate ((K, Na)NbO$_3$: KNN) layer, or the like. To the piezoelectric layer 24, an additive such as manganese, niobium, or silicon may be added.

The second electrode 26 is provided on the piezoelectric layer 24. Although not shown in the drawing, the second electrode 26 may be further provided on a side face of the piezoelectric layer 24 and on the metal oxide layer 14 as long as the second electrode 26 is electrically separated from the first electrode 22.

The shape of the second electrode 26 is, for example, a layer shape. The thickness of the second electrode 26 is, for example, 15 nm or more and 300 nm or less. The second electrode 26 is, for example, a metal layer such as an iridium layer, a platinum layer, a titanium layer, or a ruthenium layer, an electrically conductive oxide layer thereof, a strontium ruthenate layer, a lanthanum nickel oxide layer, or the like. The second electrode 26 may have a structure in which a plurality of layers exemplified above are stacked.

The second electrode 26 is the other electrode for applying a voltage to the piezoelectric layer 24. The second electrode 26 is an upper electrode provided on the piezoelectric layer 24.

2. Method for Producing Piezoelectric Actuator

Figure 3:
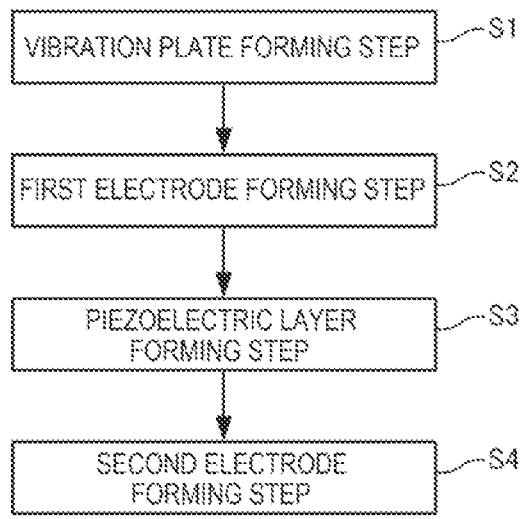
FIG. 3 is a flowchart for illustrating a method for producing a piezoelectric actuator according to an embodiment.
Figure 4:
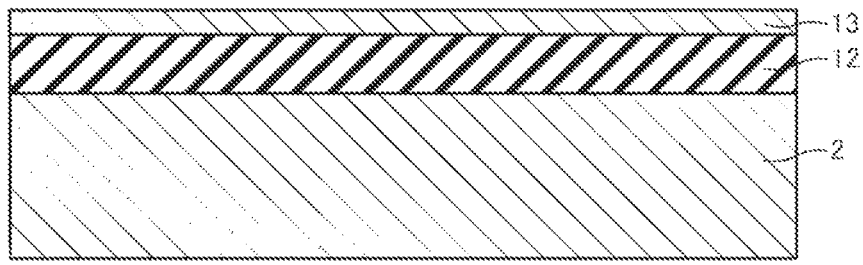
FIG. 4 is a cross-sectional view schematically showing a step of producing a piezoelectric actuator according to the embodiment.
Figure 5:
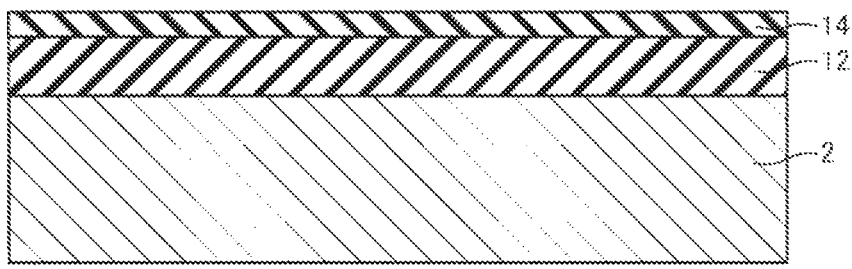
FIG. 5 is a cross-sectional view schematically showing a step of producing a piezoelectric actuator according to the embodiment.

Next, a method for producing the piezoelectric actuator 100 according to this embodiment will be described with reference to the drawings. FIG. 3 is a flowchart for illustrating the method for producing the piezoelectric actuator 100 according to this embodiment. FIGS. 4 and 5 are each a cross-sectional view schematically showing a step of producing the piezoelectric actuator 100 according to this embodiment.

As shown in FIG. 3, the method for producing the piezoelectric actuator 100 includes a vibration plate forming step (Step S1) of forming the vibration plate 10, a first electrode forming step (Step S2) of forming the first electrode 22, a piezoelectric layer forming step (Step S3) of forming the piezoelectric layer 24, and a second electrode forming step (Step S4) of forming the second electrode 26.

In the vibration plate forming step (Step S1), as shown in FIG. 4, for example, the basal plate 2 that is a silicon substrate is thermally oxidized, whereby the silicon oxide layer 12 is formed.

Subsequently, the metal layer 13 is formed on the silicon oxide layer 12 by a gas phase method. As the gas phase method, for example, a sputtering method is exemplified. The metal layer 13 is a layer containing zirconium. The metal layer 13 is, for example, a zirconium layer.

As shown in FIG. 5, the metal layer 13 is fired, whereby the metal oxide layer 14 is formed. The metal layer 13 is oxidized and converted into the metal oxide layer 14 by firing. The firing temperature is, for example, 850° C. or higher and 1000° C. or lower, preferably 900° C. or higher and 950° C. or lower. When the firing temperature is 850° C. or higher, the metal oxide layer 14 can be prevented from peeling from the metal layer 13. When the firing temperature is 1000° C. or lower, occurrence of a crack in the metal oxide layer 14 due to too high firing temperature can be prevented.

As shown in FIG. 1, by performing the step of forming the metal layer 13 by a gas phase method and the step of forming the metal oxide layer 14 by firing the metal layer 13, one metal oxide layer 14 is formed (single layer forming step). By repeating the step, the vibration plate 10 in which a plurality of metal oxide layers 14 are stacked is formed. The number of repetitions of the step of forming the metal oxide layer 14 is not particularly limited.

In the first electrode forming step (Step S2), as shown in FIG. 1, the first electrode 22 is formed on the vibration plate 10. The first electrode 22 is formed by, for example, a sputtering method, a chemical vapor deposition (CVD) method, a vacuum deposition method, or the like. Subsequently, the first electrode 22 is patterned by, for example, photolithography and etching.

In the piezoelectric layer forming step (Step S3), the piezoelectric layer 24 is formed on the first electrode 22. The piezoelectric layer 24 is formed by, for example, a liquid phase method such as a sol gel method or a metal organic deposition (MOD) method, a chemical solution deposition (CSD) method, a sputtering method, a CVD method, a laser abrasion method, or the like. Subsequently, the piezoelectric layer 24 is patterned by, for example, photolithography and etching.

In the second electrode forming step (Step S4), the second electrode 26 is formed on the piezoelectric layer 24. The second electrode 26 is formed by, for example, a sputtering method, a CVD method, a vacuum deposition method, or the like. Subsequently, the second electrode 26 is patterned by, for example, photolithography and etching. The second electrode 26 and the piezoelectric layer 24 may be patterned in the same step.

Subsequently, the basal plate 2 is etched from a lower face side, whereby the opening portion 4 is formed in the basal plate 2.

By the above steps, the piezoelectric actuator 100 can be produced.

The method for producing the piezoelectric actuator 100 has, for example, the following effects.

In the method for producing the piezoelectric actuator 100, the vibration plate forming step (Step S1) has a single layer forming step including forming the metal layer 13 containing zirconium by a gas phase method, and forming the metal oxide layer 14 by firing the metal layer 13, and the single layer forming step is repeated, thereby forming the vibration plate 10 in which the metal oxide layers 14 are stacked. The thickness T of the metal oxide layer 14 is less than 200 nm.

Therefore, as compared with a case where the thickness T of the metal oxide layer is 200 nm or more, the piezoelectric actuator 100 in which the metal oxide layer 14 is less likely to be peeled from the interface between the metal oxide layer 14 and the silicon oxide layer 12 and the interface between the metal oxide layer 14 and the metal oxide layer 14 even if it is exposed to a high temperature and high humidity environment can be produced (for details, see the below-mentioned "5. Experimental Examples"). Further, as compared with a case where the metal oxide layer is formed by a liquid phase method, the metal oxide layer 14 is less likely to be peeled. Therefore, the piezoelectric actuator 100 having high durability and reliability can be produced.

Further, in the method for producing the piezoelectric actuator 100, a single layer of the metal layer 13 containing zirconium is formed by a gas phase method, and therefore, the metal oxide layer 14 has a columnar crystal structure. Further, in the vibration plate forming step (Step S1), a step of forming the metal oxide layer 14 by forming the metal layer 13 and then firing the metal layer 13 is repeatedly performed. Therefore, as shown in FIG. 2, in the two metal oxide layers 14, the grain boundary GB of one of the metal oxide layers 14 and the grain boundary GB of the other metal oxide layer 14 are shifted in a lateral direction. A crack is likely to occur along the grain boundary GB. Therefore, in the piezoelectric actuator 100, the grain boundaries GB are shifted, and therefore, even if a crack has occurred along the grain boundary GB of one of the metal oxide layers 14, progress of the crack can be stopped at the interface between the lower face 14a of one of the metal oxide layers 14 and the upper face 14b of the other metal oxide layer 14. For example, in the two metal oxide layers, when the grain boundaries GB are aligned, progress of the crack cannot be stopped, and the metal oxide layer is likely to be peeled. Note that the single layer means a layer composed of one layer.

Further, the metal oxide layer 14 has a columnar crystal structure, and therefore, as compared with a case where a metal oxide layer has a granular crystal structure, the ratio of the grain boundaries GB in the metal oxide layer 14 can be decreased. A gap is likely to be generated at the grain boundaries GB, and when a gap is generated, a binding strength between the crystal grains G is decreased. For example, moisture in the air penetrates along the grain boundaries GB. Therefore, by adopting the columnar crystal structure in which the ratio of the grain boundaries GB is small for the metal oxide layer 14, peeling of the metal oxide layer 14 can be prevented. Note that when the metal oxide layer containing zirconium is formed by a liquid phase method, the metal oxide layer has a granular crystal structure.

In the method for producing the piezoelectric actuator 100, the thickness T of the metal oxide layer 14 may be 50 nm or more and 150 nm or less. Therefore, the piezoelectric actuator 100 in which the metal oxide layer 14 is less likely to be peeled can be produced. Further, if a metal oxide layer having a thickness T less than 50 nm is tried to be formed, the cost is increased. Therefore, by setting the thickness T to 50 nm or more, the increase in the production cost can be suppressed.

In the method for producing the piezoelectric actuator 100, the metal oxide layer 14 is a zirconium oxide layer, and in the XRD of the metal oxide layer 14, the ratio R of the intensity of the peak $P_{(-211)}$ to the intensity of the peak $P_{(-111)}$ may be 0.36 or less. When the ratio R is 0.36 or less, unevenness at the interface between the metal oxide layer 14 and the silicon oxide layer 12 can be prevented from occurring, and a gap is less likely to be generated at the interface. Therefore, the metal oxide layer 14 is less likely to be peeled from the silicon oxide layer 12.

In the method for producing the piezoelectric actuator 100, in the metal oxide layer 14, the intensity of the peak $P_{(111)}$ may be higher than the intensity of the peak $P_{(-211)}$. Here, the peak $P_{(-111)}$ and the peak $P_{(-211)}$ are attributed to the metal oxide layer 14 that is a monoclinic crystal system, and the peak $P_{(111)}$ is attributed to the metal oxide layer 14 that is a tetragonal crystal system. The metal oxide layer 14 that is a tetragonal crystal system is converted into a monoclinic crystal system by applying an external force and increases its volume. Due to this, a crack occurs, and when a force is applied to the metal oxide layer 14 that is a tetragonal crystal system, the metal oxide layer 14 is converted from the tetragonal crystal system to a monoclinic crystal system and increases its volume, and progress of the crack can be stopped. Therefore, when the metal oxide layer 14 that is a tetragonal crystal system is present to such an extent that the intensity of the peak $P_{(111)}$ is higher than the intensity of the peak $P_{(-211)}$, even if a crack occurs in the metal oxide layer 14, progress of the crack can be stopped. When the thickness T of the metal oxide layer 14 is set to 150 nm or less, the crystal grains of the metal oxide layer 14 become dense. Due to this, the ratio of the crystal grains attributed to a monoclinic crystal system adjacent to the crystal grains attributed to a tetragonal crystal system is increased, and the occurrence of a crack is more easily suppressed.

3. Liquid Ejection Head

Figure 6:
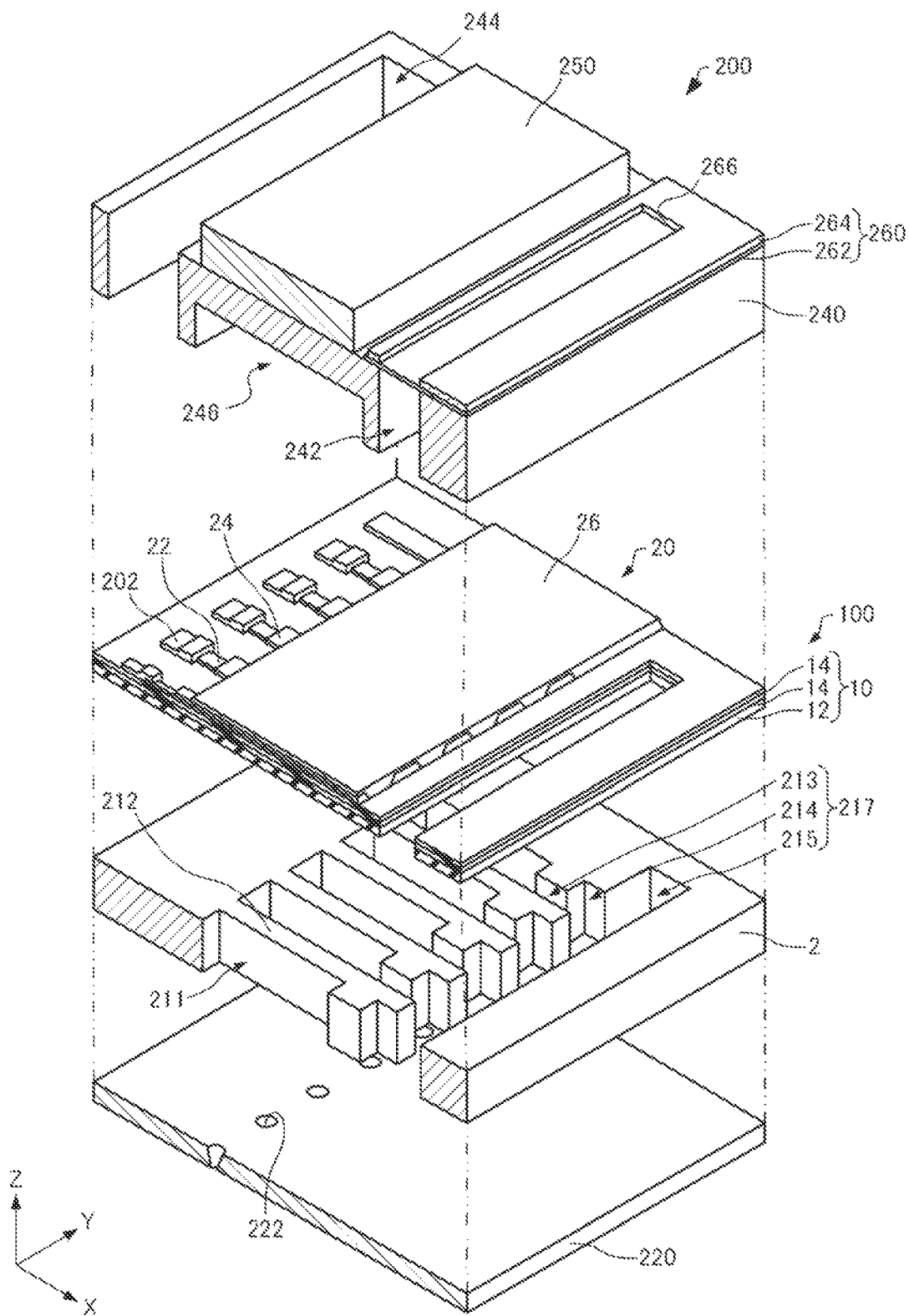
FIG. 6 is an exploded perspective view schematically showing a liquid ejection head according to an embodiment.
Figure 7:
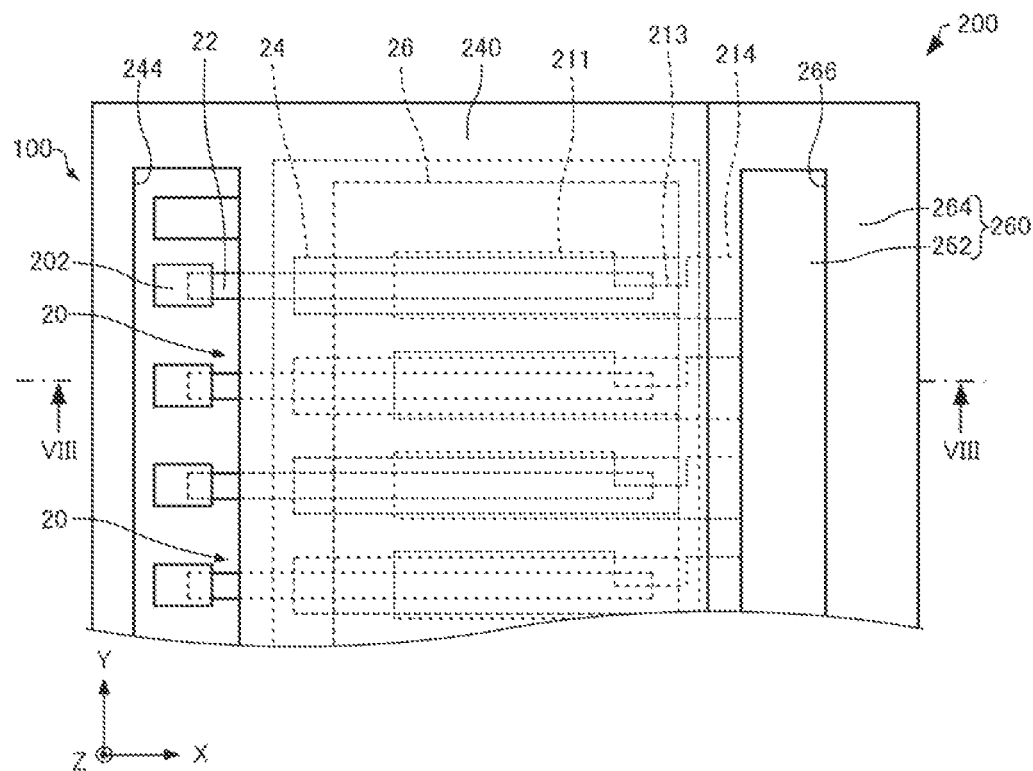
FIG. 7 is a plan view schematically showing the liquid ejection head according to the embodiment.
Figure 8:
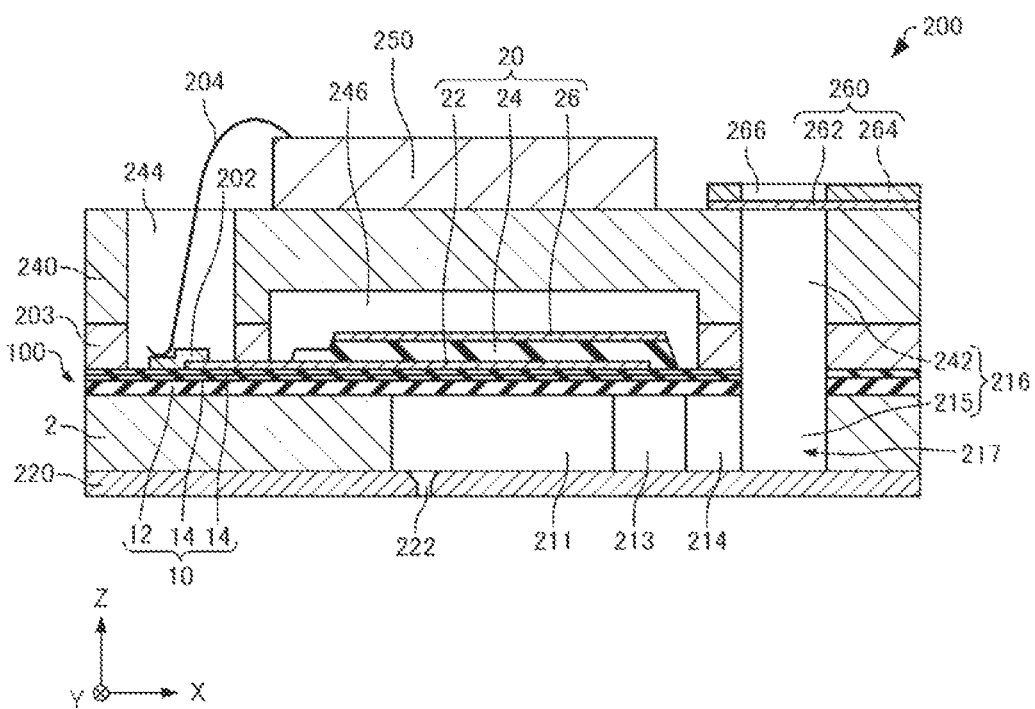
FIG. 8 is a cross-sectional view schematically showing the liquid ejection head according to the embodiment.

Next, a liquid ejection head according to this embodiment will be described with reference to the drawings. FIG. 6 is an exploded perspective view schematically showing a liquid ejection head 200 according to this embodiment. FIG. is a plan view schematically showing the liquid ejection head 200 according to this embodiment. FIG. 8 is a cross-sectional view taken along the line VIII-VIII in FIG. 7 schematically showing the liquid ejection head 200 according to this embodiment. In FIGS. 6 to 8, X axis, Y axis, and Z axis are shown as three axes orthogonal to one another. Further, in FIGS. 6 and 8, the piezoelectric element 20 is shown in a simplified manner.

As shown in FIGS. 6 to 8, the liquid ejection head 200 includes, for example, a basal plate 2, a piezoelectric actuator 100, a nozzle plate 220, a protective substrate 240, a circuit board 250, and a compliance substrate 260. In FIG. 7, illustration of the circuit board 250 is omitted for the sake of convenience.

In the basal plate 2, a pressure generating chamber 211 is provided. The pressure generating chamber 211 is divided by a plurality of partitions 212. The volume of the pressure generating chamber 211 is changed by the piezoelectric element 20.

A first communication path 213 and a second communication path 214 are provided at an end in the positive X-axis direction of the pressure generating chamber 211 of the basal plate 2. The first communication path 213 is configured such that an opening area thereof becomes smaller by narrowing the end in the positive X-axis direction of the pressure generating chamber 211 from the Y-axis direction. The width in the Y-axis direction of the second communication path 214 is, for example, the same as the width in the Y-axis direction of the pressure generating chamber 211. In the positive X-axis direction of the second communication path 214, a third communication path 215 that communicates with a plurality of second communication paths 214 is provided. The third communication path 215 constitutes a part of a manifold 216. The manifold 216 becomes a liquid chamber common to the respective pressure generating chambers 211. In this manner, in the basal plate 2, a supply flow path 217 composed of the first communication path 213, the second communication path 214, and the third communication path 215, and the pressure generating chamber 211 are provided. The supply flow path 217 communicates with the pressure generating chamber 211 and supplies a liquid to the pressure generating chamber 211.

The nozzle plate 220 is provided at one face of the basal plate 2. A material of the nozzle plate 220 is, for example, steel use stainless (SUS). The nozzle plate 220 is joined to the basal plate 2 using, for example, an adhesive, a heat-welding film, or the like. In the nozzle plate 220, a plurality of nozzle holes 222 are provided along the Y axis. The nozzle holes 222 communicate with the pressure generating chamber 211 and eject a liquid. A vibration plate 10 is provided at the other face of the basal plate 2.

A plurality of piezoelectric elements 20 are provided. The number of piezoelectric elements 20 is not particularly limited.

In the liquid ejection head 200, by deformation of the piezoelectric layer 24 having an electromechanical conversion property, the vibration plate 10 and the first electrode 22 are displaced. That is, in the liquid ejection head 200, the vibration plate 10 and the first electrode 22 substantially have a function as a vibration plate.

The first electrode 22 is constituted as an individual electrode independent for each pressure generating chamber 211. The width in the Y-axis direction of the first electrode 22 is narrower than the width in the Y-axis direction of the pressure generating chamber 211. The length in the X-axis direction of the first electrode 22 is longer than the length in the X-axis direction of the pressure generating chamber 211. In the X-axis direction, both ends of the first electrode 22 are located across both ends of the pressure generating chamber 211. To the end in the negative X-axis direction of the first electrode 22, a lead electrode 202 is coupled.

The width in the Y-axis direction of the piezoelectric layer 24 is, for example, wider than the width in the Y-axis direction of the first electrode 22. The length in the X-axis direction of the piezoelectric layer 24 is, for example, longer than the length in the X-axis direction of the pressure generating chamber 211. The end in the positive X-axis direction of the first electrode 22 is located, for example, between the end in the positive X-axis direction of the piezoelectric layer 24 and the end in the positive X-axis direction of the pressure generating chamber 211. The end in the positive X-axis direction of the first electrode 22 is covered with the piezoelectric layer 24. On the other hand, the end in the negative X-axis direction of the piezoelectric layer 24 is located, for example, between the end at the negative X-axis direction side of the first electrode 22 and the end in the positive X-axis direction of the pressure generating chamber 211. The end at the negative X-axis direction side of the first electrode 22 is not covered with the piezoelectric layer 24.

The second electrode 26 is, for example, continuously provided on the piezoelectric layer 24 and the vibration plate 10. The second electrode 26 is constituted as an electrode common to the plurality of piezoelectric elements 20.

The protective substrate 240 is joined to the basal plate 2 using an adhesive 203. In the protective substrate 240, a through hole 242 is provided. In the example shown in the drawing, the through hole 242 passes through the protective substrate 240 in the Z-axis direction and communicates with the third communication path 215. The through hole 242 and the third communication path 215 constitute the manifold 216 to serve as a liquid chamber common to the respective pressure generating chambers 211. Further, in the protective substrate 240, a through hole 244 that passes through the protective substrate 240 in the Z-axis direction is provided. In the through hole 244, an end in the negative X-axis direction of the lead electrode 202 is located.

In the protective substrate 240, an opening portion 246 is provided. The opening portion 246 is a space for preventing inhibition of driving of the piezoelectric element 20. The opening portion 246 may be sealed or need not be sealed.

The circuit board 250 is provided on the protective substrate 240. The circuit board 250 includes a semiconductor integrated circuit (IC) for driving the piezoelectric element 20. The circuit board 250 and the lead electrode 202 are electrically coupled to each other through a coupling wire 204.

The compliance substrate 260 is provided on the protective substrate 240. The compliance substrate 260 has a sealing layer 262 provided on the protective substrate 240, and a fixing plate 264 provided on the sealing layer 262. The sealing layer 262 is a layer for sealing the manifold 216. The sealing layer 262 has, for example, flexibility. In the fixing plate 264, a through hole 266 is provided. The through hole 266 passes through the fixing plate 264 in the Z-axis direction. The through hole 266 is provided at a position overlapping with the manifold 216 when seen from the Z-axis direction.

4. Printer

Next, a printer according to this embodiment will be described with reference to the drawing. FIG. 9 is a perspective view schematically showing a printer 300 according to this embodiment.

The printer 300 is an inkjet-type printer. As shown in FIG. 9, the printer 300 includes a head unit 310. The head unit 310 has, for example, a liquid ejection head 200. The number of liquid ejection heads 200 is not particularly limited. In the head unit 310, cartridges 312 and 314 constituting a supply unit are detachably provided. A carriage 316 on which the head unit 310 is mounted is provided freely movable in an axial direction to a carriage shaft 322 attached to a device body 320 and ejects a liquid supplied from a liquid supply unit.

Here, the liquid may be any as long as it is a material in a state when a substance is a liquid phase, and a material in a liquid state like a sol, a gel, or the like is also included in the liquid. Further, not only a liquid as one state of a substance, but also a material in which particles of a functional material composed of a solid such as a pigment or metal particles are dissolved, dispersed, or mixed in a solvent, etc. are included in the liquid. Typical examples of the liquid include an ink and a liquid crystal emulsifier. The ink is assumed to include various liquid compositions such as general aqueous inks and oily inks, gel inks, and hot-melt inks.

In the printer 300, a driving force of a drive motor 330 is transmitted to the carriage 316 through a plurality of gears (not shown) and a timing belt 332, and thereby the carriage 316 on which the head unit 310 is mounted is moved along the carriage shaft 322. On the other hand, the device body 320 is provided with a conveyance roller 340 as a conveyance mechanism for relatively moving a sheet S that is a recording medium such as paper with respect to the liquid ejection head 200. The conveyance mechanism for conveying the sheet S is not limited to the conveyance roller, and may be a belt, a drum, or the like.

The printer 300 includes a printer controller 350 as a control unit that controls the liquid ejection head 200 and the conveyance roller 340. The printer controller 350 is electrically coupled to the circuit board 250 of the liquid ejection head 200. The printer controller 350 includes, for example, a random access memory (RAM) that temporarily stores various data, a read only memory (ROM) that stores a control program or the like, a central processing unit (CPU), and a drive signal generation circuit that generates a drive signal to be supplied to the liquid ejection head 200, and the like.

The piezoelectric actuator 100 can be used in a wide range of applications without being limited to a liquid ejection head and a printer. The piezoelectric actuator 100 is favorably used in, for example, an ultrasonic motor, a vibration-type dust remover, a piezoelectric transformer, a piezoelectric speaker, a piezoelectric pump, a pressure-electric converter, or the like.

5. Experimental Examples

5.1. Preparation of Samples

An $SiO_2$ layer was formed by thermal oxidation of a silicon substrate. Subsequently, a Zr layer was formed on the $SiO_2$ layer by a sputtering method. Subsequently, the Zr layer was converted into a $ZrO_2$ layer by performing firing at 850 to 1000° C. FIG. 10 is a table showing the configuration of the $ZrO_2$ layer prepared in Experimental Examples.

In Experimental Examples 1 to 5, as shown in FIG. 10, one $ZrO_2$ layer having a different thickness was formed. The thickness of the Zr layer was set to a value obtained by dividing the target thickness of the $ZrO_2$ layer by 1.44. For example, in Experimental Example 1, the target thickness of the $ZrO_2$ layer was 50 nm, and therefore, the Zr layer having a thickness of about 35 nm was formed.

In Experimental Examples 6 to 11, two $ZrO_2$ layers were formed by repeating formation of a Zr layer by a sputtering method and oxidation of the Zr layer by firing. In each of the Experimental Examples 6 to 11, the thickness of the $ZrO_2$ layer as the first layer and the thickness of the $ZrO_2$ layer as the second layer are different.

In Experimental Example 12, three $ZrO_2$ layers were formed by repeating formation of a Zr layer by a sputtering method and oxidation of the Zr layer by firing.

In Experimental Example 13, four $ZrO_2$ layers were formed by repeating formation of a Zr layer by a sputtering method and oxidation of the Zr layer by firing.

In Experimental Example 14, a $ZrO_2$ layer as a first layer was formed by formation of a Zr layer by a sputtering method and oxidation of the Zr layer by firing, and thereafter, a $ZrO_2$ layer as a second layer was formed by a liquid phase method. In the liquid phase method, a compound of Zr and an organic substance was applied, followed by firing at 850° C. to 1000° C.

5.2. Evaluation of Durability Against Environmental Change

With respect to the samples prepared as described above, evaluation of durability against environmental change was performed. Specifically, with respect to the samples exposed to a dry environment at a temperature of 45° C. and a humidity of 5% for 24 hours, and the samples exposed to a high temperature and high humidity environment at a temperature of 45° C. and a humidity of 95% for 24 hours, a scratch test was performed. In the scratch test, a pressure was increased until the $ZrO_2$ layer was peeled, and the pressure (mN) at which the $ZrO_2$ layer was peeled was recorded as a scratch strength. In the scratch test, "CRS-5000" manufactured by RHESCA, Co., Ltd. was used.

In FIG. 10, evaluation of an amount of change in the scratch strength in the dry environment and in the high temperature and high humidity environment is shown as the evaluation of durability against the environmental change. In the scratch test, the obtained value was changed according to a parameter such as a curvature radius of a tip of a needle used for scratching, and therefore, relative comparison was performed using the amount of change. The criteria for the evaluation shown in FIG. 10 are as follows.

A: The amount of change in the scratch strength is less than 3%.
B: The amount of change in the scratch strength is 3% or more and less than 10%.
C: The amount of change in the scratch strength is 10% or more.

Note that the amount of change in the scratch strength was determined according to the following formula.

"Amount of change in scratch strength"=("Scratch strength in dry environment"−"Scratch strength in high temperature and high humidity environment")/"Scratch strength in dry environment"×100

As shown in FIG. 10, for the samples in which the thickness of the one $ZrO_2$ layer is 200 nm or more, the evaluation of durability is lower as compared with that for the samples in which the thickness of the one $ZrO_2$ layer is less than 200 nm. With respect to the sample in which the thickness of the one $ZrO_2$ layer is less than 200 nm, even if the $ZrO_2$ layers are stacked, the evaluation of durability is high. Accordingly, it was found that by setting the thickness of one $ZrO_2$ layer less than 200 nm, the $ZrO_2$ layer is less likely to be peeled.

In Experimental Example 14 in which the $ZrO_2$ layer as the second layer was formed by a liquid phase method, although the thickness was 100 nm, the evaluation of durability was "C". When the cross section of the $ZrO_2$ layer as the second layer was observed using an SEM, the $ZrO_2$ layer as the second layer of Experimental Example 14 had a granular crystal structure. On the other hand, the $ZrO_2$ layers formed by formation of a Zr layer by a sputtering method and oxidation of the Zr layer all had a columnar crystal structure. Accordingly, it was found that the $ZrO_2$ layer having a columnar crystal structure is less likely to be peeled as compared with the $ZrO_2$ layer having a granular crystal structure.

In FIG. 10, in the samples for which the evaluation of durability was "C", the $ZrO_2$ layer was peeled at the interface between the $ZrO_2$ layer and the $SiO_2$ layer or at the interface between the $ZrO_2$ layer and the $ZrO_2$ layer, and did not undergo fracture (brittle fracture) in which the surface of the $ZrO_2$ layer or the inside of the $ZrO_2$ layer was ruptured and broken.

Further, before performing the scratch test, the samples were exposed to heavy water at 70° C. to 80° C. for 24 hours, and thereafter, secondary ion mass spectrometry (SIMS) analysis was performed. As a result, in the samples for which the evaluation of durability was "C", a reaction with heavy water was observed in at least one of the interface between the $ZrO_2$ layer and the $SiO_2$ layer and the interface between the $ZrO_2$ layer and the $ZrO_2$ layer. Accordingly, it was found that by setting the thickness of the $ZrO_2$ layer to 200 nm or less and forming the Zr layer by a gas phase method, a gap can be made less likely to be generated between the metal oxide layer and the silicon oxide layer, and moisture that penetrates into the interface between the metal oxide layer and the silicon oxide layer can be reduced. Further, it was found that a gap can be made less likely to be generated between the metal oxide layer and the metal oxide layer, and moisture that penetrates into the interface between the metal oxide layer and the metal oxide layer can be reduced.

5.3. XRD Measurement

Before performing the scratch test, XRD measurement (out-of-plane measurement) was performed for the samples. In the XRD measurement, "D8 Discover with GADDS" manufactured by Bruker Corporation was used. In the XRD measurement, a Cu-Kα ray was used. In the XRD measurement, the acceptance angle was set as follows: 2 theta: 20° to 50°, gamma: −95° to −85°. The device arrangement of XRD was set as follows: frame angles: 2 theta: 35°, omega: 10°, phi: 0°, chi: 90°.

Figure 11:
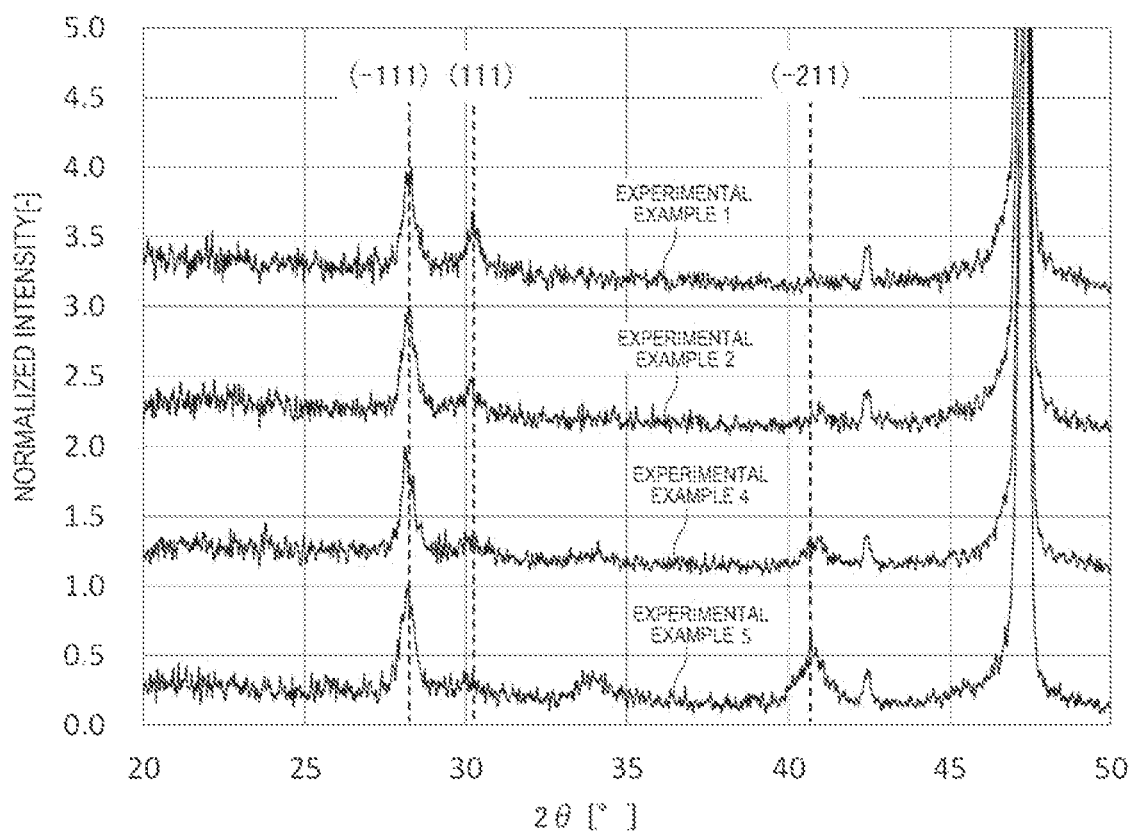
FIG. 11 is a graph showing XRD measurement results of Experimental Examples.
Figure 12:
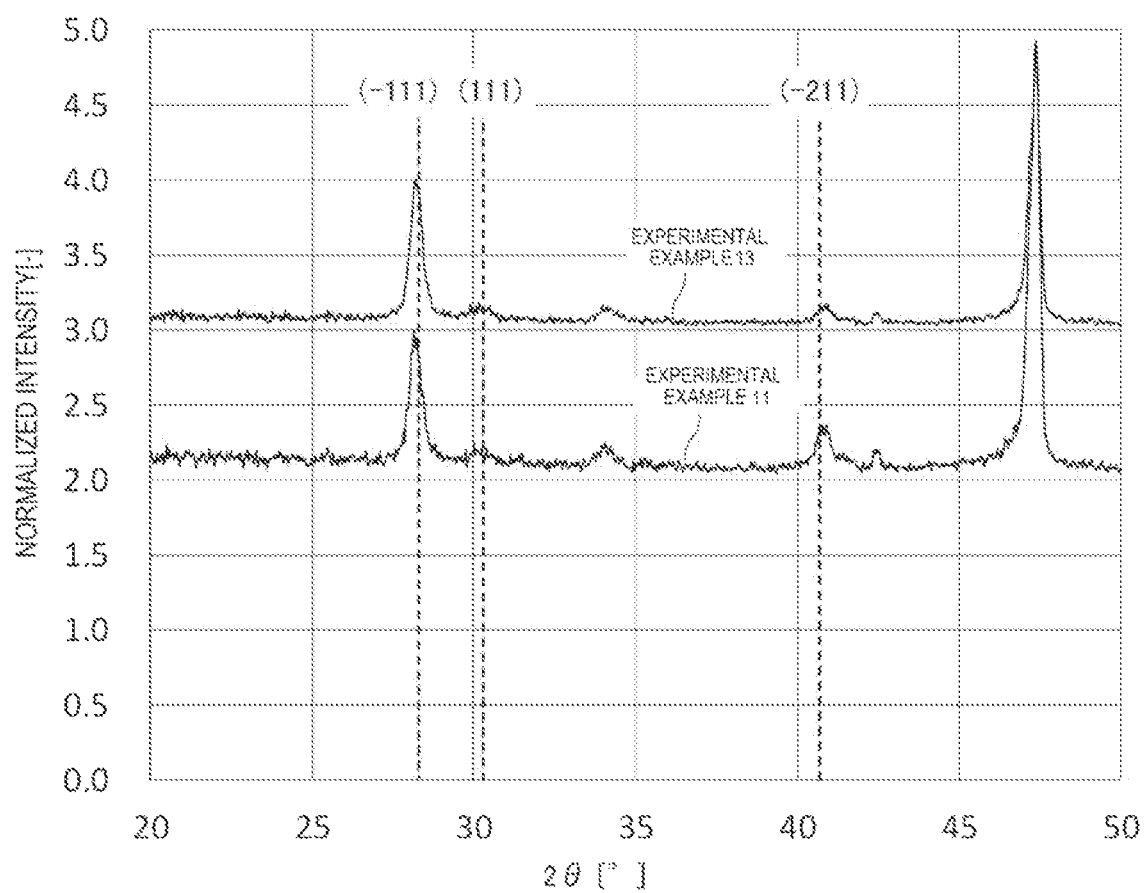
FIG. 12 is a graph showing XRD measurement results of Experimental Examples.

The XRD measurement was performed for Experimental Examples 1, 2, 4, 5, 11, and 13. FIG. 11 is a graph showing the XRD measurement results of Experimental Examples 1, 2, 4, and 5. FIG. 12 is a graph showing the XRD measurement results of Experimental Examples 11 and 13.

As shown in FIGS. 11 and 12, in Experimental Examples 1, 2, 4, 5, 11, and 13, a peak $P_{(-111)}$ attributed to a (−111) plane of the $ZrO_2$ layer and a peak $P_{(-211)}$ attributed to a (−211) plane of the $ZrO_2$ layer were confirmed. In FIG. 10, a ratio R of an intensity of the peak $P_{(-211)}$ to an intensity of the peak $P_{(-111)}$ is shown.

As shown in FIG. 10, it was found that for the samples in which the intensity ratio R is 0.36 or less, the evaluation of durability is more favorable as compared with a case where the intensity ratio R is larger than 0.36.

As shown in FIGS. 11 and 12, in Experimental Examples 1 and 2, an intensity of a peak $P_{(111)}$ attributed to a (111) plane of the $ZrO_2$ layer was higher than an intensity of a peak $P_{(-211)}$ attributed to a (−211) plane of the $ZrO_2$ layer.

The present disclosure is not limited to the embodiments described above, and various modifications may be made. For example, the present disclosure includes substantially the same configurations as the configurations described in the embodiments. The substantially the same configurations are, for example, configurations having the same functions, methods, and results, or configurations having the same objects and effects. Further, the present disclosure includes configurations in which non-essential parts of the configurations described in the embodiments are substituted. Further, the present disclosure includes configurations having the same effects as in the configurations described in the embodiments, or configurations capable of achieving the same objects as in the configurations described in the embodiments. In addition, the present disclosure includes configurations in which a known technique is added to the configurations described in the embodiments.

What is claimed is:

1. A piezoelectric actuator, comprising:
   a vibration plate;
   a first electrode on the vibration plate;
   a piezoelectric layer on the first electrode; and
   a second electrode on the piezoelectric layer;
   wherein the vibration plate has at least a first layer that is a single metal oxide layer containing zirconium, and a second layer that is a single metal oxide layer containing zirconium;
   the first layer and the second layer are stacked on each other; and
   a grain boundary of the first layer and a grain boundary of the second layer are shifted in a lateral direction.

2. The piezoelectric actuator according to claim 1, wherein each of the first layer and the second layer have a thickness of 50 nm or more.

3. The piezoelectric actuator according to claim 1, wherein each of the first layer and the second layer have a thickness of 150 nm or less.

4. The piezoelectric actuator according to claim 1, wherein each of the first layer and the second layer have a columnar crystal structure.

5. The piezoelectric actuator according to claim 1, wherein the metal oxide layer is a zirconium oxide layer, and in X-ray diffraction of the metal oxide layer, a ratio of an intensity of a peak attributed to a (−211) plane to an intensity of a peak attributed to a (−111) plane is 0.36 or less.

6. The piezoelectric actuator according to claim 5, wherein a position of the peak attributed to the (−111) plane is 28.1° or more and 28.5° or less, and
   a position of the peak attributed to the (−211) plane is 40.4° or more and 41.4° or less.

7. The piezoelectric actuator according to claim 5, wherein an intensity of a peak attributed to a (111) plane is higher than the intensity of the peak attributed to the (−211) plane, and a position of the peak attributed to the (111) plane is 29.5° or more and 30.5° or less.

8. The piezoelectric actuator according to claim 1, wherein each of the first layer and the second layer have a thickness less than 200 nm.

* * * * *